(12) United States Patent
Osawa et al.

(10) Patent No.: US 8,134,335 B2
(45) Date of Patent: Mar. 13, 2012

(54) CAR POWER SOURCE APPARATUS

(75) Inventors: Takeshi Osawa, Hyogo (JP); Ryuta Iwasaki, Hyogo (JP)

(73) Assignee: Sanyo Electric Co., Ltd., Osaka (JP)

( * ) Notice: Subject to any disclaimer, the term of this patent is extended or adjusted under 35 U.S.C. 154(b) by 740 days.

(21) Appl. No.: 12/232,574

(22) Filed: Sep. 19, 2008

(65) Prior Publication Data

US 2009/0079434 A1   Mar. 26, 2009

(30) Foreign Application Priority Data

Sep. 26, 2007   (JP) .................................. 2007-250285

(51) Int. Cl.
*H02J 7/00* (2006.01)
(52) U.S. Cl. ........... 320/116; 324/426; 324/434; 429/61
(58) Field of Classification Search ............... 320/116, 320/127, 132, 136; 324/426, 434; 429/61
See application file for complete search history.

(56) References Cited

U.S. PATENT DOCUMENTS

| | | | | |
|---|---|---|---|---|
| 2006/0006840 A1* | 1/2006 | Furukawa | ...................... | 320/116 |
| 2007/0090804 A1* | 4/2007 | Kim et al. | ...................... | 320/132 |
| 2008/0158756 A1* | 7/2008 | Lindsey et al. | .................. | 361/88 |
| 2009/0027819 A1* | 1/2009 | Priel et al. | ....................... | 361/86 |

FOREIGN PATENT DOCUMENTS

JP   2006-25502   1/2006

* cited by examiner

*Primary Examiner* — Huy Q Phan
*Assistant Examiner* — Son Le
(74) *Attorney, Agent, or Firm* — Wenderoth, Lind & Ponack, L.L.P.

(57) ABSTRACT

The car power source apparatus is provided with a leakage detection circuit 3 having a battery 1 with a plurality of battery units 2 connected in series, a first series circuit 11 made up of first leakage detection resistors 12 and a first leakage detection switch 13 to connect the first connection node 10 of the series connected battery units 2 to ground 9, a second series circuit 21 made up of second leakage detection resistors 22 and a second leakage detection switch 23 to connect the second connection node 20 of the series connected battery units 2 to ground 9, and voltage detection circuits 4 to detect voltage of the first leakage detection resistors 12 and the second leakage detection resistors 22. Further, the car power source apparatus is provided with a failure detection circuit 5 to control the first leakage detection switch 13 and the second leakage detection switch 23 ON and OFF and determine failure of the leakage detection circuit 3 from voltages detected by the voltage detection circuits 4.

15 Claims, 9 Drawing Sheets

10 ··· FIRST CONNECTION NODE
13 ··· FIRST LEAKAGE DETECTION SWITCH
20 ··· SECOND CONNECTION NODE

US 8,134,335 B2

CAR POWER SOURCE APPARATUS

BACKGROUND OF THE INVENTION

1. Field of the Invention

This invention relates to a car power source apparatus that powers the driving motor of an electric vehicle such as a hybrid car or electric car, and specifically relates to a car power source apparatus provided with a leakage current detection circuit to detect leakage current.

2. Description of the Related Art

In a car power source apparatus that powers an electric vehicle, it is necessary to produce a high voltage to increase output power. This is because output power is proportional to the product of the voltage and current, and because the higher the voltage, the more favorable the response when the motor is activated. For example, output voltage of a power source apparatus to drive a hybrid car or electric automobile is extremely high such as 200V or more. In a high voltage power source apparatus, there is a danger of electric shock for a hands-on mechanic during maintenance work. Therefore, from safety considerations, the power source apparatus is not electrically connected to the chassis. Consequently, to detect electric shock and disconnect the power source apparatus from other circuitry, the ability to detect leakage resistance is provided. Leakage resistance is resistance between the power source apparatus and the chassis. A car power source apparatus that detects leakage resistance is cited in Japanese Patent Laid-Open Publication No. 2006-25502.

FIG. 1 shows the detection circuit to detect leakage resistance of the power source apparatus cited in Japanese Patent Laid-Open Publication No. 2006-25502. The leakage detection circuits 80 shown in this figure have series circuits 91 of leakage detection resistors 92 and leakage detection switches 93 connected to battery 82 connection nodes 90. There are two sets of series circuits 91. The first series circuit 91A and the second series circuit 91B are connected to different connection nodes 90, 90. Further, the leakage detection circuits 80 are provided with voltage detection circuits 94 to detect the voltage developed across the leakage detection resistors 92. The leakage detection switches 93 of the first series circuit 91A and the second series circuit 91B are alternately switched on allowing the leakage detection circuits 80 to detect leakage resistance.

SUMMARY OF THE INVENTION

In addition, the power source apparatus of FIG. 1 can switch on both leakage detection switches 93 and detect failure of the first series circuit 91A and the second series circuit 91B. Since current flows through the loop shown by broken line A in FIG. 1 when both leakage detection switches 93 are turned on, failure of the series circuits 91 and leakage detection switches 93 can be determined. For example, if a leakage detection switch fails to switch on, or if the electrical resistance of a leakage detection resistor changes, the voltage across the leakage detection resistor will change.

However, in the actual case where a leakage current develops, the leakage detection circuit 80 of FIG. 1 cannot accurately determine failure of the first series circuit 91A or the second series circuit 91B. This is because, as shown by broken line B, if a leakage resistance is connected in parallel, leakage current flows through the leakage detection resistor 92 and changes the voltage drop across that leakage detection resistor 92. Consequently, even though the leakage detection circuit is not failing, it is judged as failing because of the leakage current. Since the vehicle must be stopped if the leakage detection circuit fails, it is important to accurately determine failure of the leakage detection circuit.

The present invention was developed to realize this object. Thus, it is a primary object of the present invention to provide a car power source apparatus that can accurately determine leakage detection circuit failure even when leakage current occurs.

The car power source apparatus of the present invention is provided with the following structure to achieve the object stated above. The car power source apparatus is provided with a leakage detection circuit 3 having a battery 1 with a plurality of battery units 2 connected in series, a first series circuit 11 made up of first leakage detection resistors 12 and a first leakage detection switch 13 to connect the first connection node 10 of the series connected battery units 2 to ground 9, a second series circuit 21 made up of second leakage detection resistors 22 and a second leakage detection switch 23 to connect the second connection node 20 of the series connected battery units 2 to ground 9, and voltage detection circuits 4 to detect voltage at the first leakage detection resistors 12 and the second leakage detection resistors 22. Further, the car power source apparatus is provided with a failure detection circuit 5 to control the first leakage detection switch 13 and the second leakage detection switch 23 ON and OFF and determine failure of the leakage detection circuit 3 from voltages detected by the voltage detection circuits 4.

The car power source apparatus described above has the characteristic that it can accurately determine failure of the leakage detection circuit even when battery leakage occurs. This is because the power source apparatus of the present invention controls the first leakage detection switch and the second leakage detection switch ON and OFF and determines leakage detection circuit failure from voltages detected by the voltage detection circuits.

The car power source apparatus of the present invention can determine failure of the leakage detection circuit 3 from the ratio of voltage of the first leakage detection resistors 12 and the second leakage detection resistors 22 while the failure detection circuit 5 switches the first leakage detection switch 13 and second leakage detection switch 23 ON and OFF. In the car power source apparatus of the present invention, the failure detection circuit 5 turns OFF the first leakage detection switch 13 and the second leakage detection switch 23 as a first step. The failure detection circuit 5 detects a first voltage of the first leakage detection resistors 12, a second voltage of the second leakage detection resistors 22, and a first voltage ratio for the first step, which is (the first voltage)/(the second voltage). Next, the failure detection circuit 5 turns ON the first leakage detection switch 13 and the second leakage detection switch 23 as a second step. The failure detection circuit 5 detects a first voltage of the first leakage detection resistors 12, a second voltage of the second leakage detection resistors 22, and a second voltage ratio for the second step, which is (the first voltage)/(the second voltage). Next, the failure detection circuit 5 turns ON the first leakage detection switch 13 and turns OFF the second leakage detection switch 23 as a third step. The failure detection circuit 5 detects a first voltage of the first leakage detection resistors 12, a second voltage of the second leakage detection resistors 22, and a third voltage ratio for the third step, which is (the first voltage)/(the second voltage). Finally, the failure detection circuit 5 turns OFF the first leakage detection switch 13 and turns ON the second leakage detection switch 23 as a fourth step. The failure detection circuit 5 detects a first voltage of the first leakage detection resistors 12, a second voltage of the second leakage detection resistors 22, and a fourth voltage ratio for the fourth step, which is (the first voltage)/(the second voltage). The failure detection circuit 5 can determine failure of the leakage detection circuit 3 from the first voltage ratio, the second voltage ratio, the third voltage ratio, and the fourth voltage ratio.

In the car power source apparatus of the present invention, the failure detection circuit 5 determines (the third voltage ratio)/(the first voltage ratio), (the fourth voltage ratio)/(the first voltage ratio), (the third voltage ratio)/(the second voltage ratio), and (the fourth voltage ratio)/(the second voltage ratio) from computed values of the first voltage ratio, the second voltage ratio, the third voltage ratio, and the fourth voltage ratio. The failure detection circuit 5 can determine failure of the first series circuit 11 from (the third voltage ratio)/(the first voltage ratio) and (the fourth voltage ratio)/(the second voltage ratio). The failure detection circuit 5 can determine failure of the second series circuit 21 from (the fourth voltage ratio)/(the first voltage ratio) and (the third voltage ratio)/(the second voltage ratio).

The failure detection circuit 5 can determine failure of the first series circuit 11 by comparing (the third voltage ratio)/(the first voltage ratio) and (the fourth voltage ratio)/(the second voltage ratio) with a set range. The failure detection circuit 5 can determine failure of the second series circuit 21 by comparing (the fourth voltage ratio)/(the first voltage ratio) and (the third voltage ratio)/(the second voltage ratio) with a set range.

The above and further objects of the present invention as well as the features thereof will become more apparent from the following detailed description to be made in conjunction with the accompanying drawings.

DETAILED DESCRIPTION OF THE PREFERRED EMBODIMENTS

Figure 1:
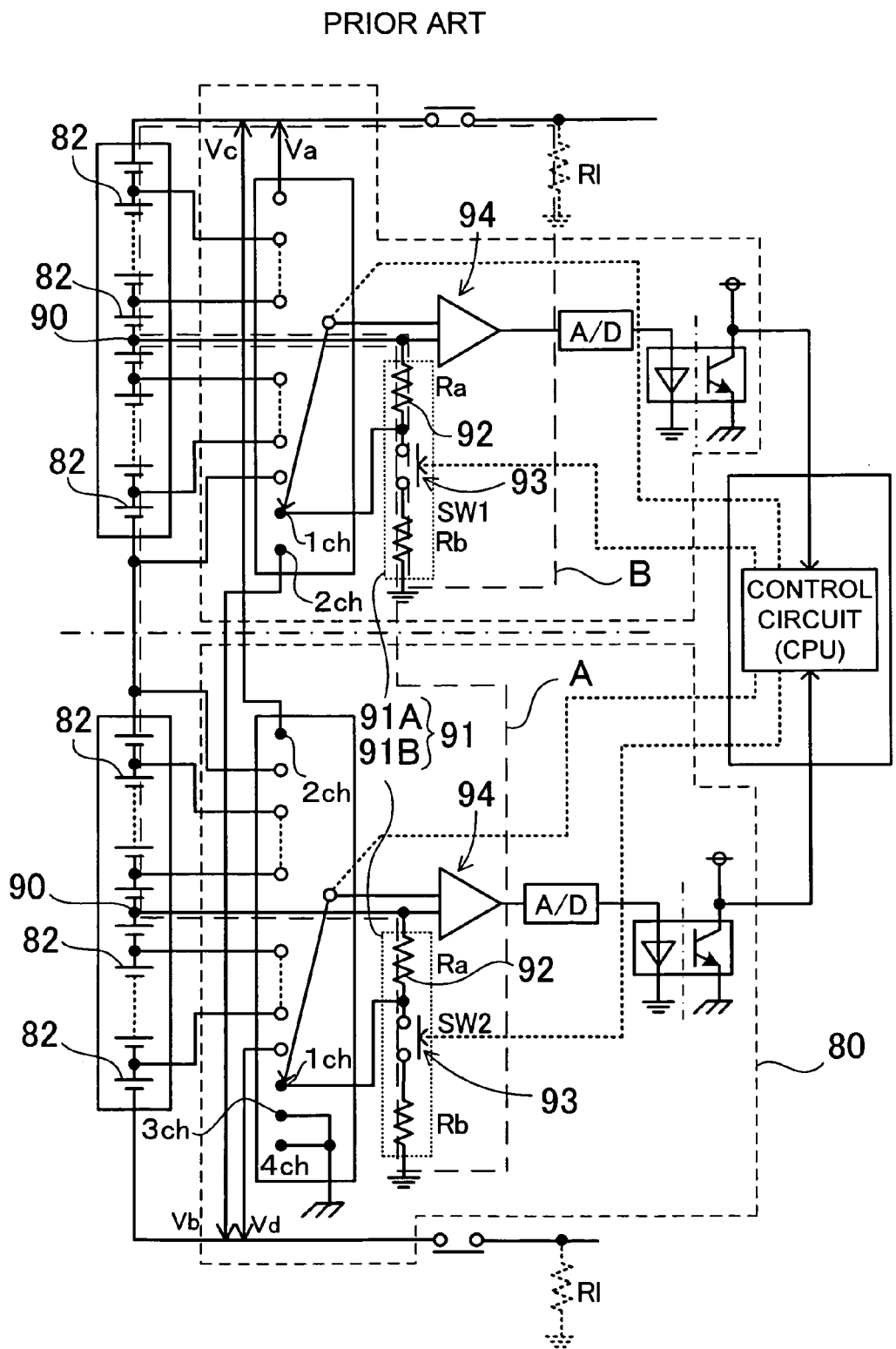
FIG. 1 is a structural diagram of a prior art car power source apparatus.
Figure 2:
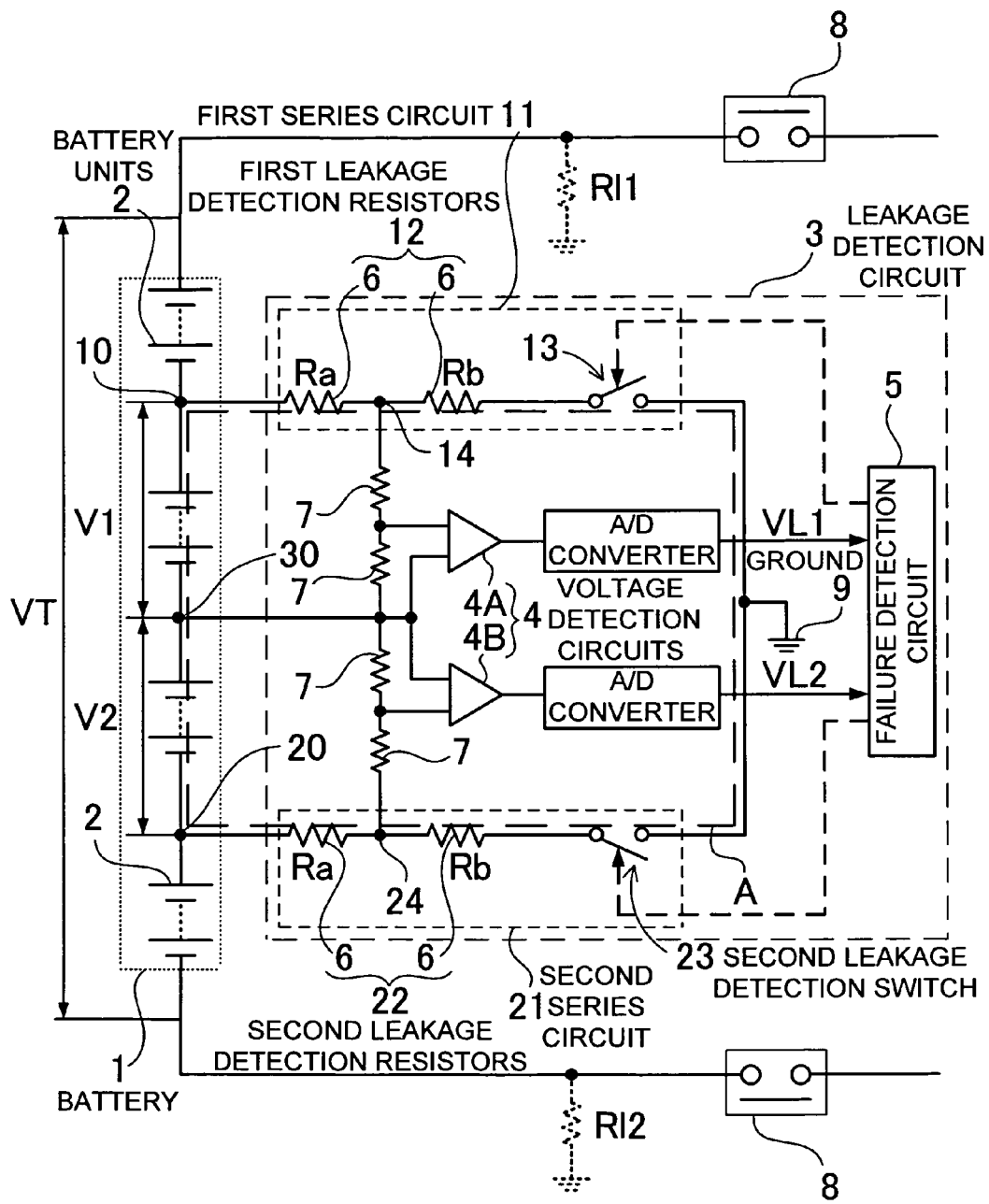
FIG. 2 is a structural diagram for one embodiment of the car power source apparatus of the present invention.

The car power source apparatus shown in FIG. 2 is provided with a driving battery 1 having a plurality of battery units 2 connected in series, and a leakage detection circuit 3 to detect leakage of the battery 1. The leakage detection circuit 3 is provided with a first series circuit 11, a second series circuit 21, voltage detection circuits 4, and a failure detection circuit 5. The first series circuit 11 is a series connection of first leakage detection resistors 12 and a first leakage detection switch 13 that connects a first connection node 10 of the battery units 2 to the chassis ground 9. The second series circuit 21 is a series connection of second leakage detection resistors 22 and a second leakage detection switch 23 that connects a second connection node 20 of the battery units 2 to the chassis ground 9. The voltage detection circuits 4 detect voltage of the first leakage detection resistors 12 and the second leakage detection resistors 22. The failure detection circuit 5 switches the first leakage detection switch 13 and the second leakage detection switch 23 ON and OFF and determines failure of the leakage detection circuit 3 from voltage detected by the voltage detection circuits 4.

The battery 1 is a series connection of a plurality of battery units 2. Battery units 2 are lithium ion batteries or nickel hydride batteries. These battery units 2 are connected in series to make battery 1 output voltage 200V or more. For example, battery 1 output voltage can be from 250V to 300V. Positive and negative output-sides of the battery 1 are connected to the car-side load (not illustrated) via contactors 8. The car-side load is a DC/AC inverter with a capacitor connected in parallel, and a motor and generator are connected to the secondary side of the DC/AC inverter. The contactors 8 are controlled ON and OFF by a control circuit (not illustrated) provided with the leakage detection circuit 3. When leakage is not detected by the leakage detection circuit 3, that is when leakage detection resistances are judged greater than set values, the control circuit switches the contactors 8ON to supply power from the battery 1 to the car-side load. When leakage is detected by the leakage detection circuit 3, that is when leakage detection resistances are found smaller than set values, the contactors 8 are switched OFF to disconnect the battery 1 from the car-side load and prevent electric shock due to battery leakage.

The first series circuit 11 is a series connection of first leakage detection resistors 12 and the first leakage detection switch 13. The first leakage detection resistors 12 are connected to the first connection node 10, and the first leakage detection switch 13 is connected to chassis ground 9. The second series circuit 21 is a series connection of second leakage detection resistors 22 and the second leakage detection switch 23. The second leakage detection resistors 22 are connected to the second connection node 20, and the second leakage detection switch 23 is connected to chassis ground 9. The first leakage detection resistors 12 and the second leakage detection resistors 22 are made equal electrical resistances. In a power source apparatus having equal first leakage detection resistors 12 and second leakage detection resistors 22, the leakage detection circuit 3 can easily detect leakage. However, the present invention does not require the first leakage detection resistors and the second leakage detection resistors always be the same electrical resistances, and leakage resistance as well as leakage detection circuit failure can be detected using different electrical resistances.

Electrical resistance of the first leakage detection resistors 12 and the second leakage detection resistors 22 is made large by connecting a plurality of detection resistors 6 in series. For example, the first leakage detection resistors 12 and the second leakage detection resistors 22 have detection resistors of several hundred KΩ connected in series to establish electrical resistance of several MΩ. Leakage detection resistors, which have a plurality of detection resistors 6 connected in series to establish high electrical resistance, can maintain a stable high-resistance state and prevent resistance variation, for example due to leakage currents while mounted on a circuit board. However, if the electrical resistance of any one of the plurality of series connected detection resistors 6 in the leakage detection resistors varies, becomes short circuited, or becomes open circuited, electrical resistance will change preventing accurate leakage detection and causing failure of the leakage detection circuit 3. Even for leakage detection resistors having only one detection resistor, the leakage detection circuit can fail due to electrical resistance variation, short circuit, or open circuit. Failure of the leakage detection circuit is determined by the failure detection circuit 5, which detects voltage of the first leakage detection resistors 12 and the second leakage detection resistors 22.

Voltage detection circuits 4 detect voltage of the first leakage detection resistors 12 and the second leakage detection resistors 22. These voltage detection circuits 4 detect voltage of the first leakage detection resistors 12 and the second leakage detection resistors 22 while the first leakage detection switch 13 and the second leakage detection switch 23 are switched ON and OFF. The voltage detection circuits 4 of FIG. 2 detect voltage with respect to an intermediate connection node 30, which is between the first connection node 10 connected to the first series circuit 11 and the second connection node 20 connected to the second series circuit 21. The intermediate connection node 30 is disposed to make the magnitude of the voltage between the first connection node 10 connected to the first series circuit 11 and the intermediate connection node 30 equal to the voltage between the second connection node 20 connected to the second series circuit 21 and the intermediate connection node 30.

In the power source apparatus of FIG. 2, voltage at a first resistor connection node 14, which is a connection node for the plurality of detection resistors 6, and voltage at a second resistor connection node 24 are voltage divided by voltage divider resistors 7 for detection. The power source apparatus of FIG. 2 is provided with two voltage detection circuits 4, which are voltage detection circuit 4A that detects voltage of the first leakage detection resistors 12 and voltage detection circuit 4B that detects voltage of the second leakage detection resistors 22. In these voltage detection circuits 4, voltage of the first leakage detection resistors 12 is detected from the difference between voltage detected by voltage detection circuit 4A and voltage (V1) between the first connection node 10 and the intermediate connection node 30. Voltage of the second leakage detection resistors 22 is detected from the difference between voltage detected by voltage detection circuit 4B and voltage (V2) between the second connection node 20 and the intermediate connection node 30.

However, a multiplexer can be connected to the input-side of a voltage detection circuit to detect voltage of the first leakage detection resistors 12 and the second leakage detection resistors 22 with one voltage detection circuit. Further, a car power source apparatus is provided with a battery voltage detection circuit (not illustrated) with a multiplexer connected to its input-side to detect the voltage of each battery unit 2. This battery voltage detection circuit can be used to detect voltage of the first leakage detection resistors 12 and the second leakage detection resistors 22. Specifically, voltage of the first leakage detection resistors 12 and voltage of the second leakage detection resistors 22 can be input to the multiplexer connected to the input-side of the battery voltage detection circuit to detect voltage of the first leakage detection resistors 12 and the second leakage detection resistors 22.

The leakage detection circuit 3 described above accurately detects leakage resistance Rl in the manner described below. Operating principles for detecting leakage resistance Rl via the leakage detection circuit 3 are described based on FIGS. 3 to 5. In the leakage detection circuit 3 shown in these figures, detection resistors Ra, Rb connected in series between the first connection node 10 and ground 9 are the first leakage detection resistors 12. Similarly, detection resistors Ra, Rb connected in series between the second connection node 20 and ground 9 are the second leakage detection resistors 22. The voltage detection circuits 4 detect the voltage of detection resistor Ra, which is a component of the first leakage detection resistors 12, via voltage detection circuit 4A, and detect the voltage of detection resistor Ra, which is a component of the second leakage detection resistors 22, via voltage detection circuit 4B. At time t with the first leakage detection switch 13 closed and the second leakage detection switch 23 open, voltage detection circuit 4A detects voltage Vl11(t) developed across detection resistor Ra of the first leakage detection resistors 12. Similarly, at time t with the second leakage detection switch 23 closed and the first leakage detection switch 13 open, voltage detection circuit 4B detects voltage Vl12(t) developed across detection resistor Ra of the second leakage detection resistors 22. In addition, the leakage detection circuit 3 of the figures is provided with a voltage detection section 40 and a leakage computation section 41. The voltage detection section 40 measures the voltage at the first connection node 10 at time t as Vg11(t), and measures the voltage at the second connection node 20 at time t as Vg12(t). For different times t1, t2, the leakage computation section 41 computes leakage resistance Rl based on equation 1 below. In the figures, current detection circuits 42 for detecting leakage currents are shown. However, as described later, current detection circuits 42 are not actually used because the leakage currents are found using calculations alone.

$$R_l = \frac{R_a}{\dfrac{V_{l2}(t_2)}{V_{g11}(t_2) - V_{g12}(t_2)} - \dfrac{V_{l11}(t_1)}{V_{g11}(t_1) - V_{g12}(t_1)}} - (R_a + R_b) \quad \text{[Equation 1]}$$

With this configuration, a leakage resistance value can easily be obtained, and a leakage resistance value for the overall circuit can be computed even for a plurality of leakage sites. Further, this leakage detection circuit 3 is provided with circuitry to measure the voltage across the battery 1 terminals at time t, VT(t). If leakage occurs at a single site, Vl(t) is the voltage across the battery 1 terminals at time t with leakage. This voltage V1(t) can be expressed as the terminal voltage VT(t) times a proportionality constant kI, or kIVT(t). The leakage computation section 41 computes kI based on equation 2 below and a leakage site is estimated based on kI.

$$k_l = \frac{\dfrac{V_{l1}(t_1)}{R_a}(R_l + R_a + R_b) + V_{g11}(t_1)}{V_T(t_1)} \quad \text{[Equation 2]}$$

$$0 \le k_l \le 1$$

This leakage detection circuit 3 can not only determine a leakage resistance value, but can also specify a leakage site. The method of detecting leakage resistance via the leakage detection circuit 3 is described in detail below.

Figure 3:
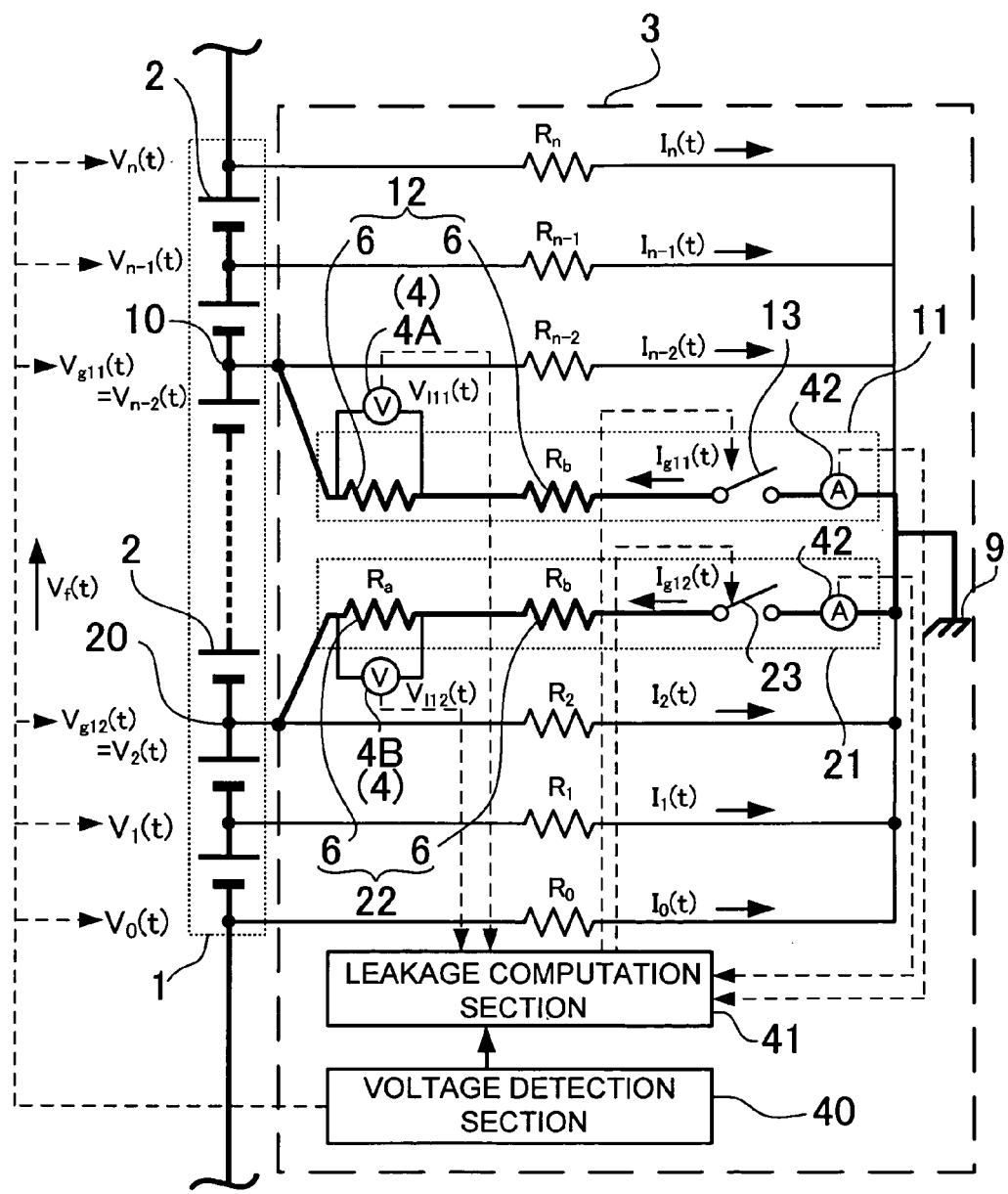
FIG. 3 is a circuit diagram showing operating principles of the leakage detection circuit for the car power source apparatus shown in FIG. 2.

The leakage detection circuit 3 shown in FIG. 3 is circuitry added to a battery 1 having n battery units 2 connected in series, and for the purpose of explanation, battery 1 circuits, such as charging and discharging circuitry, are not shown. Here, although battery units 2 are shown as individual battery cells in the figures, they can also be a plurality of battery cells connected in series or parallel.

The leakage detection circuit 3 is provided with a voltage detection section 40 that can measure the voltage at each battery unit 2 terminal V0 to Vn with a specified timing. Here, voltages measured by the voltage detection section 40 at time t are V0(t) to Vn(t). Voltages V0(t), V1(t), V2(t), . . . , Vn−1(t), Vn(t) are potentials with respect to V0(t). Since leakage can develop at any battery unit 2, there can be current flow from the terminal of any battery unit 2 to ground. Consequently, as an equivalent circuit for leakage, the terminal of each battery unit 2 is connected to ground 9 (the car chassis) via leakage resistors R0 to Rn. We assume current I0 to In flows through resistors R0 to Rn respectively. Here, currents measured by current detection circuits 42 at time t are I0($t$) to In(t). In FIG. 3, I0(t1, t2) to In(t1, t2) means I0(t1) to In(t1) or I0(t2) to In(t2).

The first connection node 10 is connected to ground through the first series circuit 11, and the second connection node 20 is connected to ground through the second series circuit 21. Here, the first connection node 10 and the second connection node 20 can also be the terminals of the battery 1. Detection resistors Ra, Rb, which make up the first leakage detection resistors 12 and the second leakage detection resistors 22, are equal in value. Further, the first leakage detection switch 13 and the second leakage detection switch 23 can open and close via separate timing.

In the example of FIG. 3, when the first leakage detection switch 13 connected with the first connection node 10 is closed at time t1, current flowing through detection resistors Ra, Rb of the first leakage detection resistors 12 is Ig11(t1). When the first leakage detection switch 13 is closed at time t2, current flowing through detection resistors Ra, Rb of the first leakage detection resistors 12 is Ig11(t2). When the second leakage detection switch 23 connected with the second connection node 20 is closed at time t1, current flowing through detection resistors Ra, Rb of the second leakage detection resistors 22 is Ig12(t1). When the second leakage detection switch 23 is closed at time t2, current flowing through detection resistors Ra, Rb of the second leakage detection resistors 22 is Ig12(t2) (here, the current detection circuit 42 is used for measured current). Voltage detection circuits 4 are used to measure the first connection node 10 voltage with respect to the first resistor connection node 14 and the second connection node 20 voltage with respect to the second resistor connection node 24 at times t1 and t2, which are Vl11(t1), Vl11(t2), Vl12(t1), and Vl12(t2). Further, if R is the combined resistance of detection resistors Ra, Rb, and Vf(t1, t2) is the voltage between the first connection node 10 and the second connection node 20, we have equations 3 below.

$$R = R_a + R_b$$

$$V_{l11}(t_1) = R_a \cdot I_{g11}(t_1)$$

$$V_{l12}(t_2) = R_a \cdot I_{g12}(t_2)$$

$$V_f(t_1) = V_{g11}(t_1) - V_{g12}(t_1)$$

$$V_f(t_2) = V_{g11}(t_2) - V_{g12}(t_2) \quad \text{[Equations 3]}$$

As previously described, Vg11($t$) is the voltage at the first connection node 10 (Vn−2(t) in FIG. 3), and Vg12($t$) is the voltage at the second connection node 20 (V2($t$) in FIG. 3). Although details will be explained later, previous equations can be used to express the value of leakage resistance Rl in FIG. 3 according to equation 4 below.

$$R_l = \left(\sum_{i=0}^{n} \frac{1}{R_i}\right)^{-1} = \frac{R_a}{\frac{V_{l12}(t_2)}{V_f(t_2)} - \frac{V_{l11}(t_1)}{V_f(t_1)}} - R \quad \text{[Equation 4]}$$

The leakage detection circuit 3 of FIG. 3 is provided with a leakage computation section 41 to detect leakage, compute leakage resistance, or detect a leakage site. The leakage computation section 41 can be implemented by gate-array (for example, field programmable gate-array [FPGA] or application specific integrated circuit [ASIC]) hardware and software. Further, a display section can be provided that can display computation results such as the leakage resistance value or leakage site. A seven-segment light emitting diode (LED) display or liquid-crystal monitor can be used as the display section.

Figure 4:
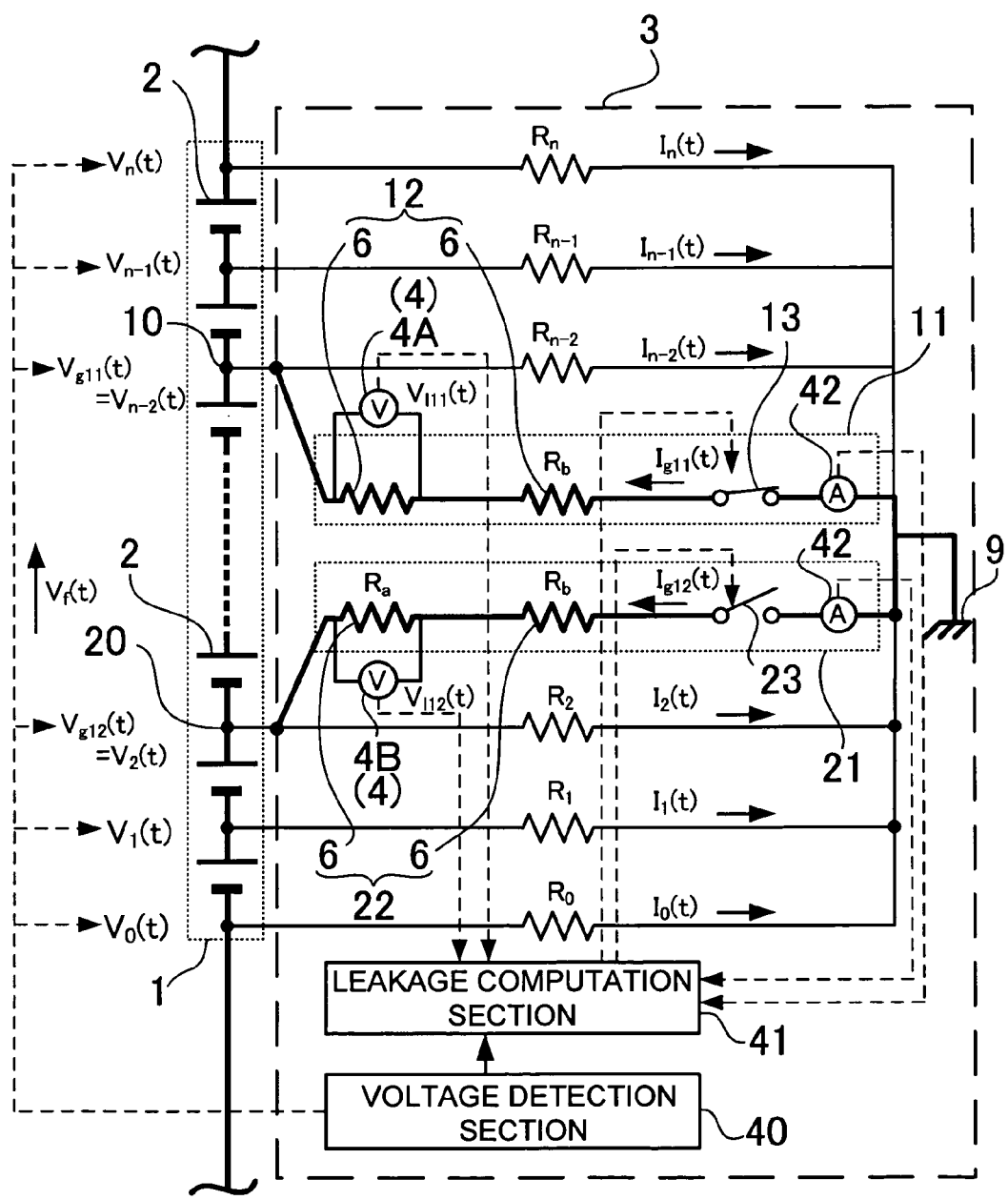
FIG. 4 is a circuit diagram showing operation at time t1 for the circuit shown in FIG. 3.

The steps for establishing the previous equations are described in detail below. First, as shown in FIG. 4, the second leakage detection switch 23 is opened and the first leakage detection switch 13 is closed at time t1. At time t1, since the current Ig11(t1), which flows through detection resistor Ra of the first leakage detection resistors 12 connected to the first connection node 10, is the sum of all the leakage currents, it can be expressed as equation 5 below.

$$I_{g11}(t_1) = I_n(t_1) + I_{n-1}(t_1) + I_{n-2}(t_1) + \ldots I_2(t_1) + I_1(t_1) + I_0(t_1) \quad \text{[Equation 5]}$$

The current In(t1) flowing in leakage resistor Rn can be found by equation 6 below. As previously described, R=Ra+Rb.

$$I_n(t_1) = \frac{\{V_n(t_1) - V_0(t_1)\} - \{(V_{g11}(t_1) - V_0(t_1)) + RI_{g11}(t_1)\}}{R_n} \quad \text{[Equation 6]}$$

$$= \frac{V_n(t_1) - (V_{g11}(t_1) + RI_{g11}(t_1))}{R_n}$$

From equations 5 and 6, Ig11(t1) can be expressed as shown in equation 7 below.

$$I_{g11}(t_1) = \frac{V_n(t_1) - (V_{g11}(t_1) + RI_{g11}(t_1))}{R_n} + \quad \text{[Equation 7]}$$

$$\frac{V_{n-1}(t_1) - (V_{g11}(t_1) + RI_{g11}(t_1))}{R_{n-1}} +$$

$$\frac{V_{n-2}(t_1) - (V_{g11}(t_1) + RI_{g11}(t_1))}{R_{n-2}} + \ldots +$$

$$\frac{V_2(t_1) - (V_{g11}(t_1) + RI_{g11}(t_1))}{R_2} +$$

$$\frac{V_1(t_1) - (V_{g11}(t_1) + RI_{g11}(t_1))}{R_1} +$$

$$\frac{V_0(t_1) - (V_{g11}(t_1) + RI_{g11}(t_1))}{R_0}$$

Combining terms, we can re-write equation 7 for Ig11 (t1) as equation 8 below.

$$I_{g11}(t_1) = \sum_{i=0}^{n} \frac{V_i(t_1)}{R_i} - V_{g11}(t_1) \sum_{i=0}^{n} \frac{1}{R_i} - RI_{g11}(t_1) \sum_{i=0}^{n} \frac{1}{R_i} \quad \text{[Equation 8]}$$

Figure 5:
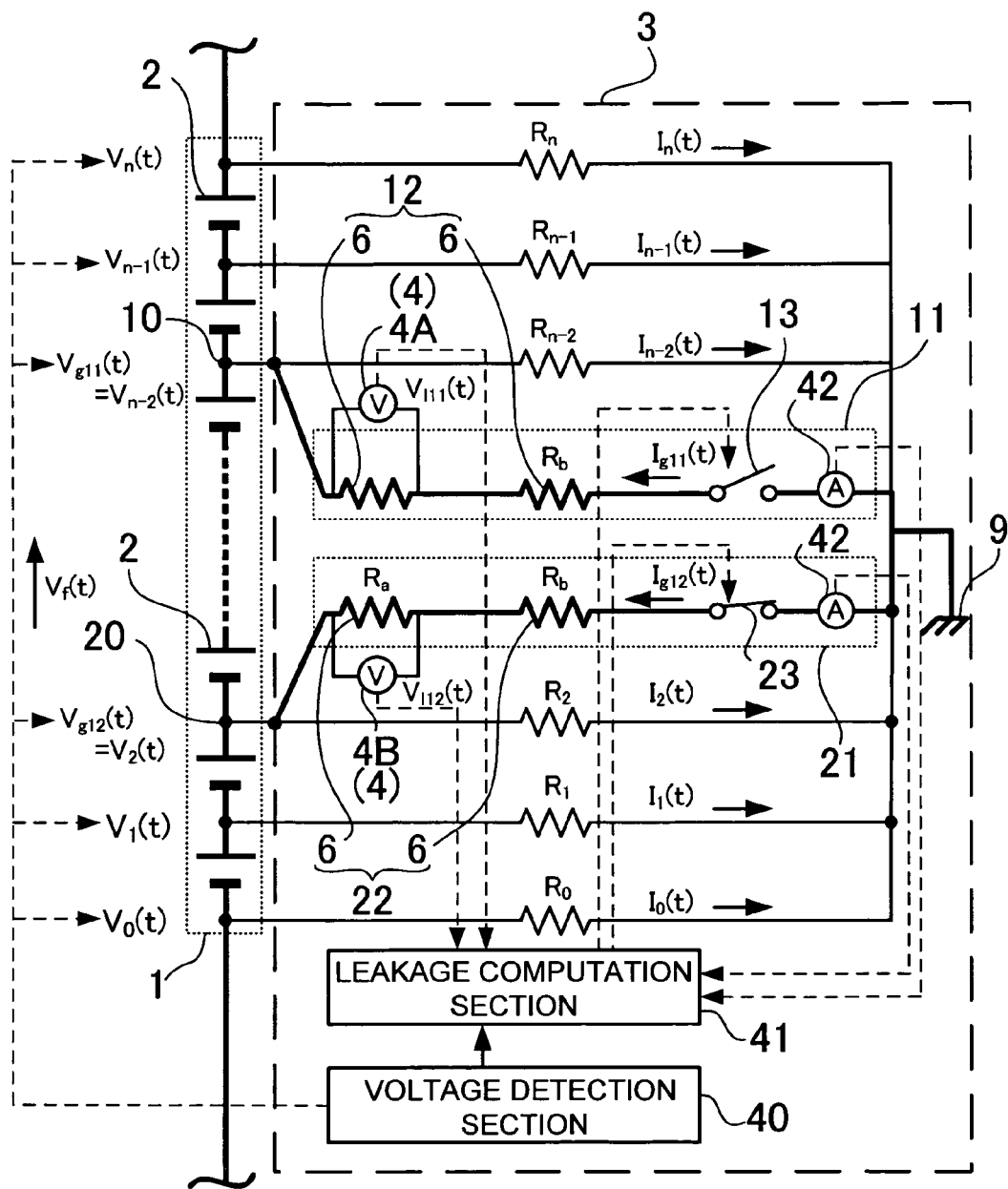
FIG. 5 is a circuit diagram showing operation at time t2 for the circuit shown in FIG. 3.

Next, as shown in FIG. 5, the first leakage detection switch 13 is opened and the second leakage detection switch 23 is closed at time t2. At time t2, since the current Ig12(t2), which flows through detection resistor Ra of the second leakage detection resistors 22 connected to the second connection node 20, is the sum of all the leakage currents, it can be expressed as equation 9 below.

$$I_{g12}(t_1) = I_n(t_2) + I_{n-1}(t_2) + I_{n-2}(t_2) + \ldots I_2(t_2) + I_1(t_2) + I_0(t_2) \quad \text{[Equation 9]}$$

Similar to the above, substituting for the current In(t2) through leakage resistor Rn, equation 9 can be expressed as equation 10 below.

$$I_{g12}(t_2) = \frac{V_n(t_2) - (V_{g12}(t_2) + RI_{g12}(t_2))}{R_n} + \frac{V_{n-1}(t_2) - (V_{g12}(t_2) + RI_{g12}(t_2))}{R_{n-1}} + \ldots + \frac{V_1(t_2) - (V_{g12}(t_2) + RI_{g12}(t_2))}{R_1} + \frac{V_0(t_2) - (V_{g12}(t_2) + RI_{g12}(t_2))}{R_0}$$
[Equation 10]

Therefore, equation 10 for Ig12(t2) can be re-written as equation 11 below.

$$I_{g12}(t_2) = \sum_{i=0}^{n} \frac{V_i(t_2)}{R_i} - V_{g12}(t_2) \sum_{i=0}^{n} \frac{1}{R_i} - RI_{g12}(t_2) \sum_{i=0}^{n} \frac{1}{R_i}$$
[Equation 11]

Here, we assume the location where leakage is generated and the leakage resistance value do not change and are time independent during detection. Therefore, the leakage site does not change even when the first leakage detection switch 13 and the second leakage detection switch 23 are switched, and we have equations 12 below.

Further, we assume the value of the leakage resistance is within a sufficiently large range. Regardless if there is leakage or no leakage, or if leakage is large or small, as long as the leakage site does not change, any arbitrary terminal voltage Vi(t) can be expressed as the product of a proportionality constant ki times the battery terminal voltage Vt(t). At times t1, t2, the same terminal voltage V1, and the battery terminal voltage Vt may vary, but the proportionality constant ki does not vary. Consequently, we can write equations 12 below.

$$V_i(t_1) = k_i(V_n(t_1) - V_o(t_1)) = k_i V_T(t_1)$$

$$V_i(t_2) = k_i(V_n(t_2) - V_o(t_2)) = k_i V_T(t_2)$$

$$(0 \leq k_i \leq 1)$$
[Equations 12]

Here, Vt(t) represents the total voltage across both terminals of the battery 1. Therefore, since individual battery units 2 are connected in series, equations 12 can be used to re-write equations 8 and 11 as equations 13 and 14 below. In this detection method, the voltage detection section 40 can measure Vn(t) and V0(t), and the leakage computation section 41 can find the difference to obtain the battery terminal voltage Vt(t). Namely, measurement of battery terminal voltage Vt(t) takes place in the circuitry of the voltage detection section 40 and the leakage computation section 41. Instead however, circuitry to directly measure battery terminal voltage Vt(t) can be provided, and Vt(t) measurement can be output to the leakage computation section.

$$I_{g11}(t_1) = V_T(t_1) \sum_{i=0}^{n} \frac{k_i}{R_i} - V_{g11}(t_1) \sum_{i=0}^{n} \frac{1}{R_i} - RI_{g11}(t_1) \sum_{i=0}^{n} \frac{1}{R_i}$$
[Equation 13]

$$I_{g12}(t_2) = V_T(t_2) \sum_{i=0}^{n} \frac{k_i}{R_i} - V_{g12}(t_2) \sum_{i=0}^{n} \frac{1}{R_i} - RI_{g12}(t_2) \sum_{i=0}^{n} \frac{1}{R_i}$$
[Equation 14]

Equation 13 can be re-written as equation 15 below.

$$\sum_{i=0}^{n} \frac{k_i}{R_i} = \frac{I_{g11}(t_1) + V_{g11}(t_1) \sum_{i=0}^{n} \frac{1}{R_i} + RI_{g11}(t_1) \sum_{i=0}^{n} \frac{1}{R_i}}{V_T(t_1)}$$
[Equation 15]

Substituting equation 15 into equation 14, equation 16 is obtained below.

$$\left( \sum_{i=0}^{n} \frac{1}{R_i} \right)^{-1} = \frac{\frac{V_{g11}(t_1)}{V_T(t_1)} - \frac{V_{g12}(t_2)}{V_T(t_2)}}{\frac{I_{g12}(t_2)}{V_T(t_2)} - \frac{I_{g11}(t_1)}{V_T(t_1)}} - R$$
[Equation 16]

Here, since voltages Vg11(t1) and Vg12(t2) do not change relative to the overall battery terminal voltage Vt(t1), Vt(t2), equations 17 are established below.

$$mV_T(t_1) = V_{g11}(t_1) - V_{g12}(t_1)$$
[Equation 17]

$$mV_T(t_2) = V_{g11}(t_2) - V_{g12}(t_2)$$

$$(0 \leq m \leq 1)$$

$$\frac{V_{g12}(t_2)}{V_T(t_2)} = \frac{V_{g12}(t_2)}{V_T(t_2)} = \varepsilon$$

In equations 17 above, $\varepsilon$ is a constant. Therefore, equation 16 can be re-written as equation 18 below.

$$\left( \sum_{i=0}^{n} \frac{1}{R_i} \right)^{-1} = \frac{\frac{V_{g11}(t_1)}{V_T(t_1)} - \frac{V_{g12}(t_1)}{V_T(t_1)}}{\frac{I_{g12}(t_2)}{V_T(t_2)} - \frac{I_{g11}(t_1)}{V_T(t_1)}} - R$$

$$= \frac{\frac{V_{g11}(t_1) - V_{g12}(t_1)}{V_T(t_1)}}{\frac{I_{g12}(t_2)}{V_T(t_2)} - \frac{I_{g11}(t_1)}{V_T(t_1)}} - R$$

$$= \frac{m \frac{V_{g11}(t_1) - V_{g12}(t_1)}{V_{g11}(t_1) - V_{g12}(t_1)}}{\frac{mI_{g12}(t_2)}{V_{g11}(t_2) - V_{g12}(t_2)} - \frac{mI_{g11}(t_2)}{V_{g11}(t_1) - V_{g12}(t_1)}} - R$$
[Equation 18]

Here, by inspection of the circuit, equations 19-22 can be established below.

$$I_{g11}(t_1) = \frac{V_{l11}(t_1)}{R_a}$$
[Equation 19]

$$I_{g12}(t_2) = \frac{V_{l12}(t_2)}{R_a}$$
[Equation 20]

$$V_{g11}(t_1) - V_{g12}(t_1) = V_f(t_1)$$
[Equation 21]

$$V_{g11}(t_2) - V_{g12}(t_2) = V_f(t_2)$$
[Equation 22]

Substituting equations 19-22 into equation 18, equation 23 is obtained below. Specifically, equation 4 for Rl is obtained.

$$\left(\sum_{i=0}^{n}\frac{1}{R_i}\right)^{-1} = \frac{R_a}{\frac{V_{l12}(t_2)}{V_f(t_2)} - \frac{V_{l11}(t_1)}{V_f(t_1)}} - R \qquad \text{[Equation 23]}$$

As described above, a composite leakage resistance value can be found by computation. This computed leakage resistance is compared with a set value in the leakage computation section 41. If the leakage resistance is less than or equal to the set value, action is taken such as displaying a warning. Now, for the case where leakage develops at a single site, computation not only of leakage resistance, but also of the leakage site is possible. Here, if we assume leakage occurs only at one point, and we hypothesize leakage resistor values are infinite at all other locations, equation 24 can be written below. Here, $0 < l < n$.

$$R_0 = R_1 = \ldots R_{l-1} = R_{l+1} \ldots = R_{n-1} = R_n = \infty \qquad \text{[Equation 24]}$$

Now, if we solve equation 13 for Ig11(t1), it can be re-written as equation 25 below.

$$I_{g11}(t_1) = \frac{V_T(t_1)\sum_{i=0}^{n}\frac{k_i}{R_i} - V_{g11}(t_1)\sum_{i=0}^{n}\frac{1}{R_i}}{1 + R\sum_{i=0}^{n}\frac{1}{R_i}} \qquad \text{[Equation 25]}$$

Substituting equation 25 for Vl11(t1) of equations 3, equation 26 is established below.

$$V_{l11}(t_1) = R_a \cdot I_{g11}(t_1) \qquad \text{[Equation 26]}$$

$$= R_a \cdot \frac{V_T(t_1)\sum_{i=0}^{n}\frac{k_i}{R_i} - V_{g11}(t_1)\sum_{i=0}^{n}\frac{1}{R_i}}{1 + R\sum_{i=0}^{n}\frac{1}{R_i}}$$

From equation 24 and since $1/\infty = 0$, summations in equation 26 reduce to kl/Rl and 1/Rl, and kl can be computed from equation 27 below.

$$k_l = \frac{\frac{V_{l11}(t_1)}{R_a}(R_l + R) + V_{g11}(t_1)}{V_T(t_1)} \qquad \text{[Equation 27]}$$

$$0 \leq k_l \leq 1$$

Here, the denominator in equation 27 Vt(t1) is Vn(t1)−V0(t1) by equations 12.

Consequently, Rl can be found from equation 23 and measured parameters, and a value of kl can be obtained by computation of equation 27. As shown in equations 12, kl is a proportionality constant multiplied by Vt(t) that indicates by voltage V1(*t*)=klVt(t) which battery unit terminal the leakage resistance Rk is connected to. Therefore, since this proportionality constant kl shows the battery unit terminal location where Rl is connected, it is possible to know the leakage generation site based on its value. In the method described above, kl can be correctly computed when the leakage site is a single location, but it is difficult to identify leakage sites when leakage occurs at a plurality of locations. However, even in this case, a composite leakage resistance value for the entire circuit can be obtained from equation 23.

In the manner described above, the leakage detection circuit 3 computes leakage resistance Rl and parameters such as kl that indicate the leakage site. Computation results are sent for additional processing as required or displayed by the display section. This method can acquire leakage-related data simply by computations based on measured values at two points in time. Therefore, it realizes the excellent characteristic that leakage information can be obtained extremely easily applying existing equipment without adding special hardware.

The failure detection circuit 5 switches the first leakage detection switch 13 and the second leakage detection switch 23 ON and OFF, and determines leakage detection circuit 3 failure from ratios of voltages for the first leakage detection resistors 12 and the second leakage detection resistors 22.

In the first step, the failure detection circuit 5 turns both the first leakage detection switch 13 and the second leakage detection switch 23 OFF. A first voltage, (VL1)step1 for the first leakage detection resistors 12, and a second voltage, (VL2)step1 for the second leakage detection resistors 22, are detected, and from (the first voltage)/(the second voltage), a first voltage ratio for the first step is determined as (VL1)step1/(VL2)step1. In the second step, both the first leakage detection switch 13 and the second leakage detection switch 23 are turned ON. A first voltage, (VL1)step2 for the first leakage detection resistors 12, and a second voltage, (VL2)step2 for the second leakage detection resistors 22, are detected, and from (the first voltage)/(the second voltage), a second voltage ratio for the second step is determined as (VL1)step2/(VL2)step2. In the third step, the first leakage detection switch 13 is turned ON and the second leakage detection switch 23 is turned OFF. A first voltage, (VL1)step3 for the first leakage detection resistors 12, and a second voltage, (VL2)step3 for the second leakage detection resistors 22, are detected, and from (the first voltage)/(the second voltage), a third voltage ratio for the third step is determined as (VL1)step3/(VL2)step3. Finally, in the fourth step, the first leakage detection switch 13 is turned OFF and the second leakage detection switch 23 is turned ON. A first voltage, (VL1)step4 for the first leakage detection resistors 12, and a second voltage, (VL2)step4 for the second leakage detection resistors 22, are detected, and from (the first voltage)/(the second voltage), a fourth voltage ratio for the fourth step is determined as (VL1)step4/(VL2)step4.

The failure detection circuit 5 determines leakage detection circuit 3 failure from the first voltage ratio, the second voltage ratio, the third voltage ratio, and the fourth voltage ratio. From the first voltage ratio, the second voltage ratio, the third voltage ratio, and the fourth voltage ratio, the failure detection circuit 5 determines (the third voltage ratio)/(the first voltage ratio), (the fourth voltage ratio)/(the first voltage ratio), (the third voltage ratio)/(the second voltage ratio), and (the fourth voltage ratio)/(the second voltage ratio). Failure of the first series circuit 11 is determined from (the third voltage ratio)/(the first voltage ratio) and (the fourth voltage ratio)/(the second voltage ratio), and failure of the second series circuit 21 is determined from (the fourth voltage ratio)/(the first voltage ratio) and (the third voltage ratio)/(the second voltage ratio).

Figure 6:
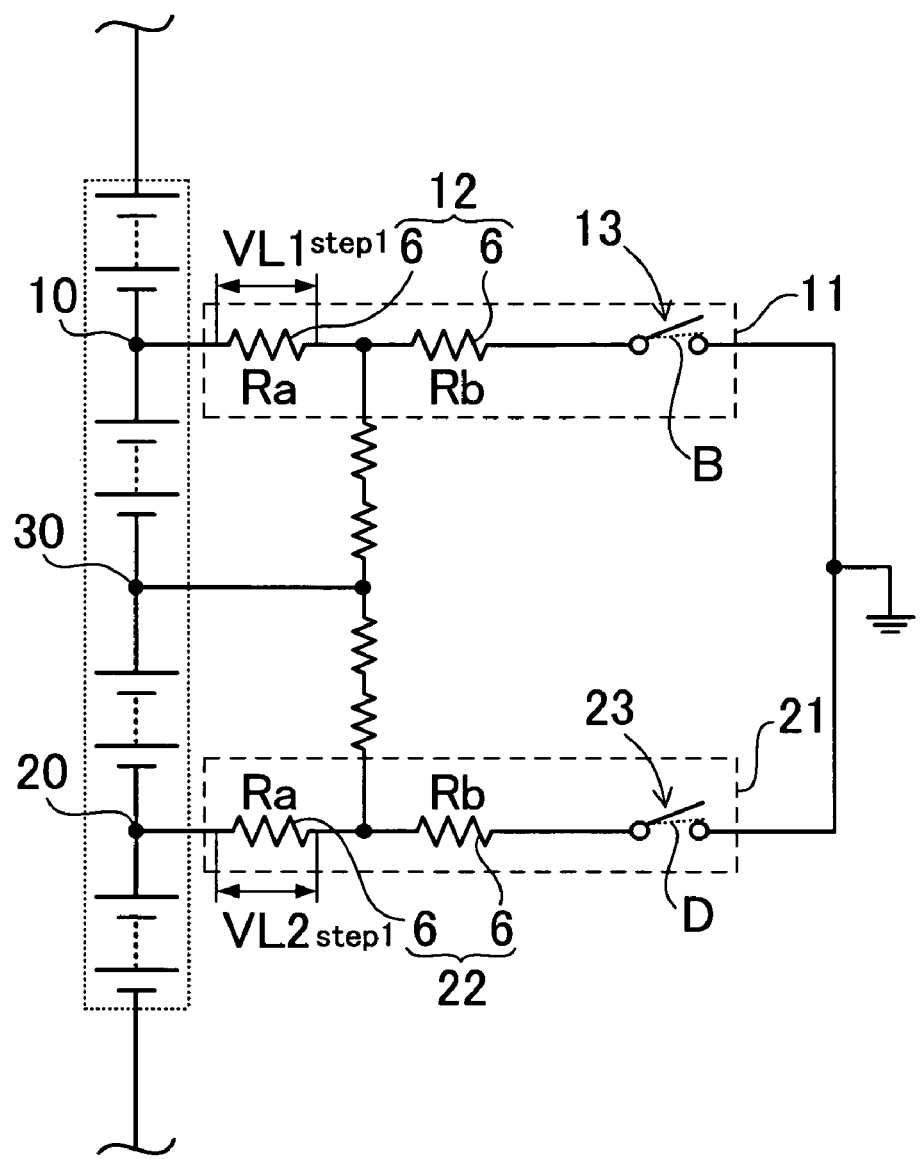
FIG. 6 is an abbreviated circuit diagram showing the first step for the leakage detection circuit.
Figure 7:
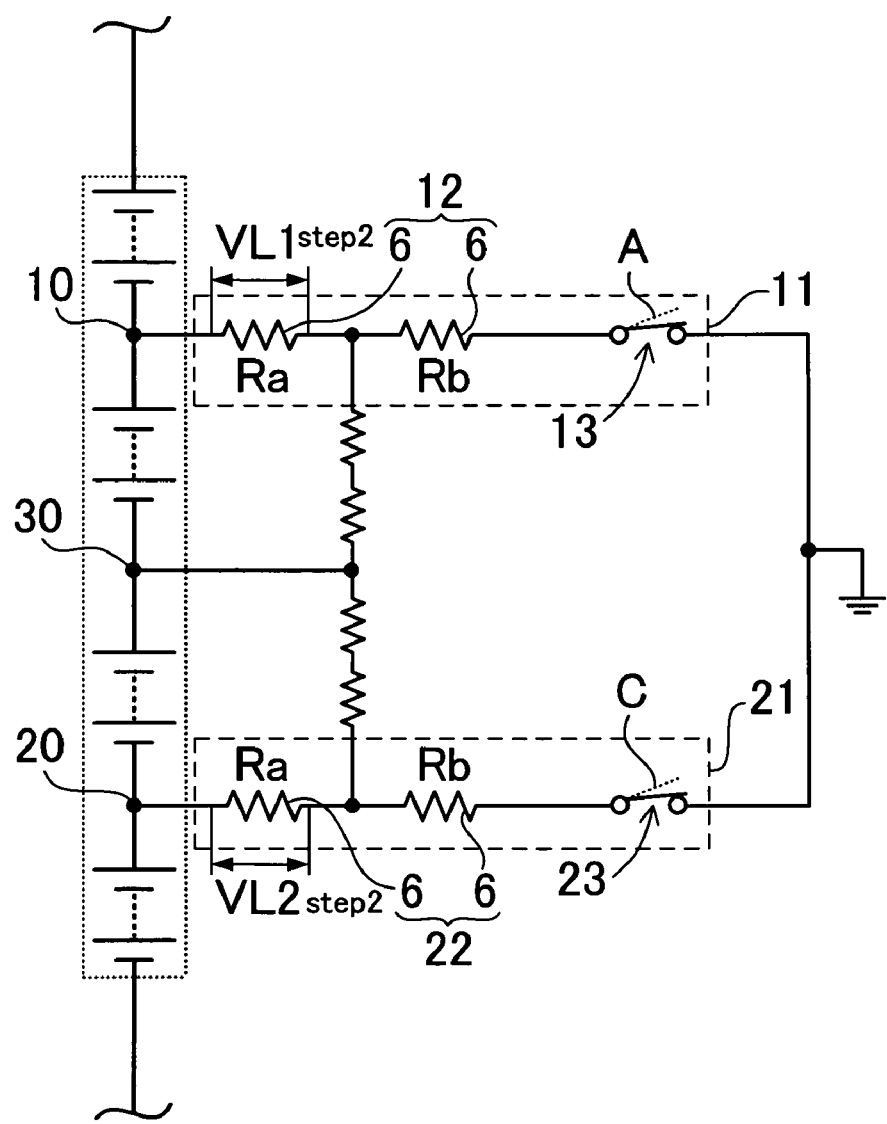
FIG. 7 is an abbreviated circuit diagram showing the second step for the leakage detection circuit.
Figure 8:
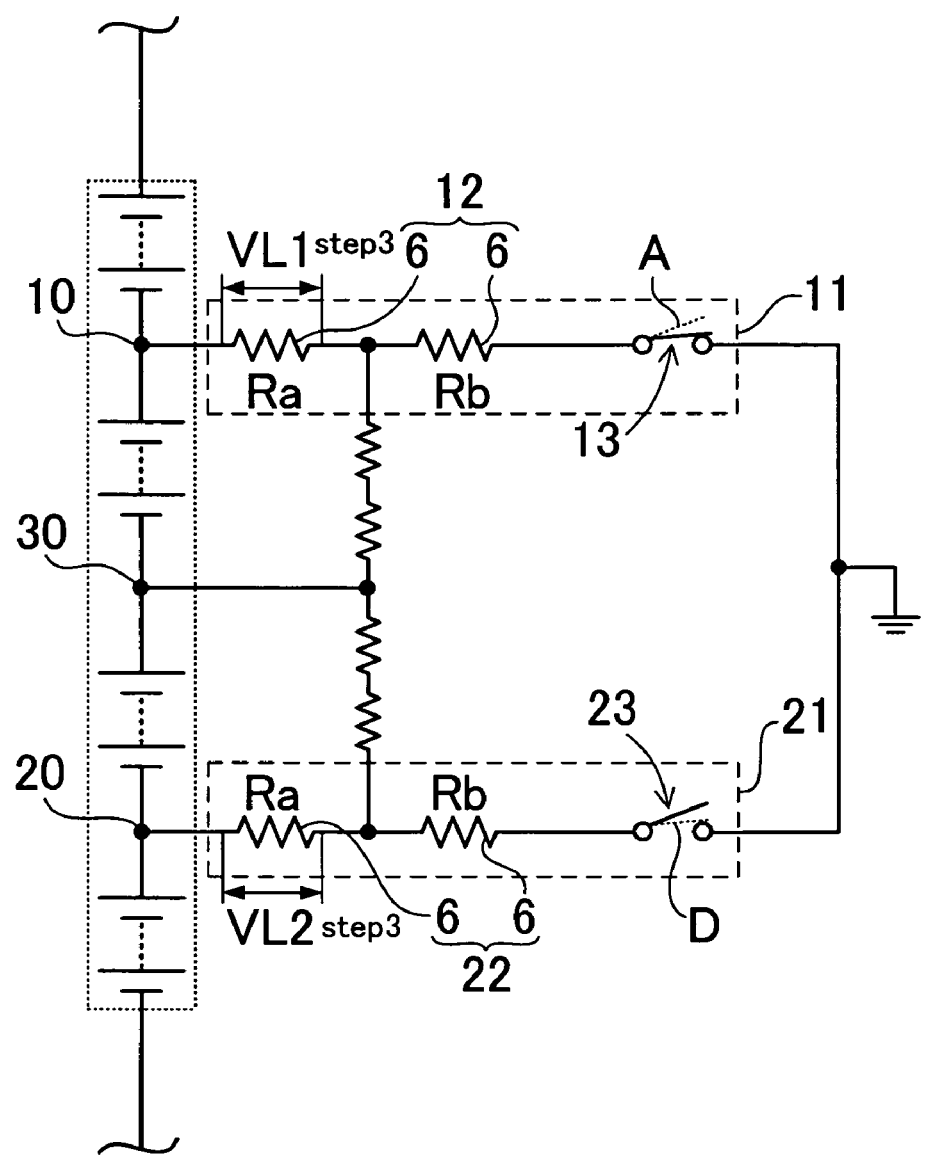
FIG. 8 is an abbreviated circuit diagram showing the third step for the leakage detection circuit.
Figure 9:
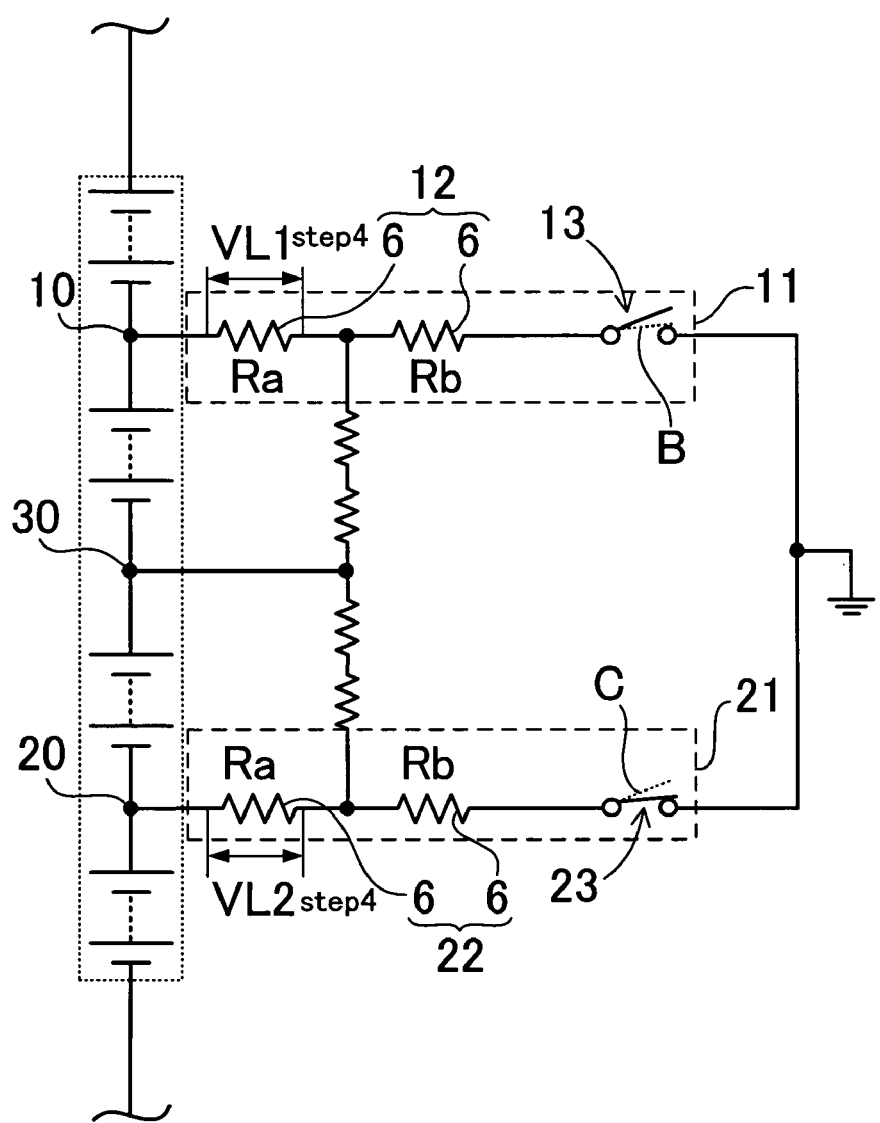
FIG. 9 is an abbreviated circuit diagram showing the fourth step for the leakage detection circuit.

Operating principles by which the failure detection circuit 5 determines leakage detection circuit 3 failure from the first voltage ratio, the second voltage ratio, the third voltage ratio, and the fourth voltage ratio is described below based on FIGS. 6-9. Here, FIG. 6 shows the first step where the first leakage detection switch 13 and the second leakage detection switch 23 are both OFF. FIG. 7 shows the second step where the first leakage detection switch 13 and the second leakage detection switch 23 are both ON. FIG. 8 shows the third step where the first leakage detection switch 13 is ON and the second leakage detection switch 23 is OFF. Finally, FIG. 8 shows the fourth step where the first leakage detection switch 13 is OFF and the second leakage detection switch 23 is ON. The failure detection circuit 5 detects voltage for the first leakage detection resistors 12 and the second leakage detection resistors 22 while switching the first leakage detection switch 13 and the second leakage detection switch 23 ON and OFF. However, if either the first leakage detection switch 13 or the second leakage detection switch 23 fails, voltage for the first leakage detection resistors 12 and the second leakage detection resistors 22 measured in steps 1-4 will become impossible to detect correctly. From voltage measured for the first leakage detection resistors 12 and the second leakage detection resistors 22 in each step, the failure detection circuit 5 determines failure of the first leakage detection switch 13 or the second leakage detection switch 23 in the following manner.

[Detection of First Leakage Detection Switch 13 Failure]
(1) This is the case where the first leakage detection switch 13 fails in the open state. If the first leakage detection switch 13 is stuck open and will not switch ON, the first leakage detection switch 13 will remain in the OFF state regardless of control signals from the failure detection circuit 5. In the second and third steps in this state, the first leakage detection switch 13 does not switch ON and is in the OFF state shown by broken line A in FIGS. 7 and 8. Consequently, the ON-OFF state of the first leakage detection switch 13 and the second leakage detection switch 23 for the third step becomes the same as that of the first step. Further, the ON-OFF state of the first leakage detection switch 13 and the second leakage detection switch 23 for the second step becomes the same as that of the fourth step. Therefore, the third voltage ratio for the third step, (VL1)step3/(VL2)step3, becomes equal to the first voltage ratio for the first step, (VL1)step1/(VL2)step1, and (the third voltage ratio)/(the first voltage ratio) becomes one. Similarly, the second voltage ratio for the second step, (VL1)step2/(VL2)step2, becomes equal to the fourth voltage ratio for the fourth step, (VL1)step4/(VL2)step4, and (the fourth voltage ratio)/(the second voltage ratio) becomes one.
(2) This is the case where the first leakage detection switch 13 fails in the short-circuited state. If the first leakage detection switch 13 is shorted and will not switch OFF, the first leakage detection switch 13 will remain in the ON state regardless of control signals from the failure detection circuit 5. In the first and fourth steps in this state, the first leakage detection switch 13 does not switch OFF and is in the ON state shown by broken line B in FIGS. 6 and 9. Consequently, the ON-OFF state of the first leakage detection switch 13 and the second leakage detection switch 23 for the first step becomes the same as that of the third step. Further, the ON-OFF state of the first leakage detection switch 13 and the second leakage detection switch 23 for the fourth step becomes the same as that of the second step. Therefore, the first voltage ratio for the first step, (VL1)step1/(VL2)step1 becomes equal to the third voltage ratio for the third step, (VL1)step3/(VL2)step3, and (the third voltage ratio)/(the first voltage ratio) becomes one. Similarly, the fourth voltage ratio for the fourth step, (VL1)step4/(VL2)step4, becomes equal to the second voltage ratio for the second step, (VL1)step2/(VL2)step2, and (the fourth voltage ratio)/(the second voltage ratio) becomes one.

Therefore, the failure detection circuit 5 can compare (the third voltage ratio)/(the first voltage ratio) and (the fourth voltage ratio)/(the second voltage ratio) with a set range of values to determine failure of the first leakage detection switch 13. Specifically, if the failure detection circuit 5 finds both (the third voltage ratio)/(the first voltage ratio) and (the fourth voltage ratio)/(the second voltage ratio) within a set range, it judges that the first leakage detection switch 13 and the first series circuit 11 have failed. Furthermore, this judgment of failure of the first leakage detection switch 13 can be accurately determined even when the battery has leakage. This is because when the first leakage detection switch 13 fails, circuits for the first step and the third step become equivalent, and circuits for the second step and the fourth step become equivalent. Therefore, voltages detected for purposes of determining first leakage detection switch 13 failure do not change independent of whether leakage occurs or not.

[Detection of Second Leakage Detection Switch 23 Failure]
(1) This is the case where the second leakage detection switch 23 fails in the open state. If the second leakage detection switch 23 is stuck open and will not switch ON, the second leakage detection switch 23 will remain in the OFF state regardless of control signals from the failure detection circuit 5. In the second and fourth steps in this state, the second leakage detection switch 23 does not switch ON and is in the OFF state shown by broken line C in FIGS. 7 and 9. Consequently, the ON-OFF state of the first leakage detection switch 13 and the second leakage detection switch 23 for the second step becomes the same as that of the third step. Further, the ON-OFF state of the first leakage detection switch 13 and the second leakage detection switch 23 for the fourth step becomes the same as that of the first step. Therefore, the second voltage ratio for the second step, (VL1)step2/(VL2)step2, becomes equal to the third voltage ratio for the third step, (VL1)step3/(VL2)step3, and (the third voltage ratio)/(the second voltage ratio) becomes one. Similarly, the fourth voltage ratio for the fourth step, (VL1)step4/(VL2)step4, becomes equal to the first voltage ratio for the first step, (VL1)step1/(VL2)step1, and (the fourth voltage ratio)/(the first voltage ratio) becomes one.
(2) This is the case where the second leakage detection switch 23 fails in the short-circuited state. If the second leakage detection switch 23 is shorted and will not switch OFF, the second leakage detection switch 23 will remain in the ON state regardless of control signals from the failure detection circuit 5. In the first and third steps in this state, the second leakage detection switch 23 does not switch OFF and is in the ON state shown by broken line D in FIGS. 6 and 8. Consequently, the ON-OFF state of the first leakage detection switch 13 and the second leakage detection switch 23 for the first step becomes the same as that of the fourth step. Further, the ON-OFF state of the first leakage detection switch 13 and the second leakage detection switch 23 for the third step becomes the same as that of the second step. Therefore, the first voltage ratio for the first step, (VL1)step1/(VL2)step1 becomes equal to the fourth voltage ratio for the fourth step, (VL1)step4/(VL2)step4, and (the fourth voltage ratio)/(the first voltage ratio) becomes one. Similarly, the third voltage ratio for the third step, (VL1)step3/(VL2)step3, becomes equal to the second voltage ratio for the second step, (VL1)step2/(VL2)step2, and (the third voltage ratio)/(the second voltage ratio) becomes one.

Therefore, the failure detection circuit 5 can compare (the fourth voltage ratio)/(the first voltage ratio) and (the third voltage ratio)/(the second voltage ratio) with a set range of values to determine failure of the second leakage detection switch 23. Specifically, if the failure detection circuit 5 finds both (the fourth voltage ratio)/(the first voltage ratio) and (the third voltage ratio)/(the second voltage ratio) within a set range, it judges that the second leakage detection switch 23 and the second series circuit 21 have failed. Furthermore, this judgment of failure of the second leakage detection switch 23 can be accurately determined even when the battery has leakage. This is because when the second leakage detection switch 23 fails, circuits for the first step and the fourth step become equivalent, and circuits for the second step and the third step become equivalent. Therefore, voltages detected for purposes of determining second leakage detection switch 23 failure do not change independent of whether leakage occurs or not.

As described above, the failure detection circuit 5 compares (the third voltage ratio)/(the first voltage ratio) and (the fourth voltage ratio)/(the second voltage ratio) with a set range of values to determine failure of the first series circuit 11. Further, the failure detection circuit 5 compares (the fourth voltage ratio)/(the first voltage ratio) and (the third voltage ratio)/(the second voltage ratio) with a set range of values to determine failure of the second series circuit 21. For example, the failure detection circuit 5 makes comparisons according to the set range of values below to determine failure of the first series circuit 11 and the second series circuit 21.

0.95<(the third voltage ratio)/(the first voltage ratio)<1.05 (a)

0.95<(the fourth voltage ratio)/(the first voltage ratio)<1.05 (b)

0.95<(the third voltage ratio)/(the second voltage ratio)<1.05 (c)

0.95<(the fourth voltage ratio)/(the second voltage ratio)<1.05 (d)

If both relations (a) and (d) are satisfied, the failure detection circuit 5 determines failure of the first series circuit 11. If both relations (b) and (c) are satisfied, the failure detection circuit 5 determines failure of the second series circuit 21.

Although series circuit failure is judged here by quotients of voltage ratios within a set range from 0.95 to 1.05, the set range can be narrowed and still allow accurate determination of series circuit failure. Further, this set range can also be changed according to the leakage resistance. For example, the set range can be widened to allow determination of series circuit failure under conditions of low leakage resistance.

Further, in the second step when the first leakage detection switch 13 and the second leakage detection switch 23 are turned ON, current flows through the first series circuit 11 and the second series circuit 21 via loop A shown by the broken line in FIG. 2. Consequently, voltage (V1+V2) between the first connection node 10 and the second connection node 20 is simply divided by the leakage detection resistors, which are a plurality of detection resistors connected in series. Voltages at the resistor connection nodes of the leakage detection resistors are detected by the voltage detection circuits 4. Therefore, the sum of the voltage at the first resistor connection node 14 (VL1) and the voltage at the second resistor connection node 24 (VL2) is (VL1−VL2). Here, since (VL2) is negative, (VL1−VL2) is the sum of the magnitudes of (VL1) and (VL2). (VL1−VL2) has a specific (voltage divider) ratio with respect to the voltage (V1+V2) between the first connection node 10 and the second connection node 20. However, if the leakage detection resistors change electrical resistance, short-circuit, open-circuit, or if the first leakage detection switch 13 or the second leakage detection switch 23 fail to switch ON, (V1+V2)/(VL2−VL1) will deviate outside a set range. Therefore, in the second step, (V1+V2)/(VL2−VL1) can be compared with a set range of values to determine failure of the leakage detection circuit 3.

However, in this method of determining leakage detection circuit 3 failure at the second step, (V1+V2)/(VL2−VL1) will also deviate from the set range when either the first leakage detection switch 13 or the second leakage detection switch 23 is stuck open. Therefore, the failure detection circuit 5 must first determine failure of the first leakage detection switch 13 or the second leakage detection switch 23 in the first step through the fourth step as described previously. After the leakage detection switches have been found normal, change in the electrical resistance of the leakage detection resistors, or leakage detection circuit 3 short-circuit or open-circuit can be determined by this method of judging leakage detection circuit 3 failure at the second step.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2007-250285 filed in Japan on Sep. 26, 2007, the content of which is incorporated herein by reference.

What is claimed is:

1. A car power source apparatus provided with a leakage detection circuit comprising:
   a battery having a plurality of battery units connected in series;
   a first series circuit made up of first leakage detection resistors and a first leakage detection switch to connect a first connection node of the series connected battery units to ground;
   a second series circuit made up of second leakage detection resistors and a second leakage detection switch to connect a second connection node of the battery units to ground;
   voltage detection circuits to detect voltage of the first leakage detection resistors and the second leakage detection resistors; and
   a failure detection circuit to control the first leakage detection switch and the second leakage detection switch ON and OFF and determine failure of the leakage detection circuit from voltages detected by the voltage detection circuits;
   wherein the failure detection circuit turns the first leakage detection switch and the second leakage detection switch OFF in a first step, a first voltage for the first leakage detection resistors and a second voltage for the second leakage detection resistors are detected, and a first voltage ratio for the first step is determined from (the first voltage)/(the second voltage);
   in a second step, the first leakage detection switch and the second leakage detection switch are turned ON, a first voltage for the first leakage detection resistors and a second voltage for the second leakage detection resistors are detected, and a second voltage ratio for the second step is determined from (the first voltage)/(the second voltage);
   in a third step, the first leakage detection switch is turned ON and the second leakage detection switch is turned OFF, a first voltage for the first leakage detection resistors and a second voltage for the second leakage detection resistors are detected, and a third voltage ratio for the third step is determined from (the first voltage)/(the second voltage);

in a fourth step, the first leakage detection switch is turned OFF and the second leakage detection switch is turned ON, a first voltage for the first leakage detection resistors and a second voltage for the second leakage detection resistors are detected, and a fourth voltage ratio for the fourth step is determined from (the first voltage)/(the second voltage); and leakage detection circuit failure is determined from the first voltage ratio, the second voltage ratio, the third voltage ratio, and the fourth voltage ratio.

2. The car power source apparatus as recited in claim 1, wherein the first leakage detection resistors and the second leakage detection resistors have the same electrical resistance.

3. The car power source apparatus as recited in claim 1, wherein the first leakage detection resistors and the second leakage detection resistors are a series connection of a plurality of detection resistors.

4. The car power source apparatus as recited in claim 1, wherein the electrical resistance of the first leakage detection resistors and the second leakage detection resistors is several MΩ.

5. The car power source apparatus as recited in claim 1, wherein the voltage detection circuits detect voltage with respect to an intermediate node between the first connection node and the second connection node connected to the first series circuit and the second series circuit.

6. The car power source apparatus as recited in claim 5, wherein the intermediate node is specified to make the voltage between the first connection node connected to the first series circuit and the intermediate node equal to the voltage between the second connection node connected to the second series circuit and the intermediate node.

7. The car power source apparatus as recited in claim 1, wherein the voltage detection circuits include a first voltage detection circuit and a second voltage detection circuit, the first voltage detection circuit is for detecting the voltage of the first leakage detection resistors, and the second voltage detection circuit is for detecting the voltage of the second leakage detection resistors.

8. The car power source apparatus as recited in claim 1, wherein the failure detection circuit determines (the third voltage ratio)/(the first voltage ratio), (the fourth voltage ratio)/(the first voltage ratio), (the third voltage ratio)/(the second voltage ratio), and (the fourth voltage ratio)/(the second voltage ratio) from the computed first voltage ratio, the second voltage ratio, the third voltage ratio, and the fourth voltage ratio; and determines failure of the first series circuit from (the third voltage ratio)/(the first voltage ratio) and (the fourth voltage ratio)/(the second voltage ratio).

9. The car power source apparatus as recited in claim 1, wherein the failure detection circuit determines (the third voltage ratio)/(the first voltage ratio), (the fourth voltage ratio)/(the first voltage ratio), (the third voltage ratio)/(the second voltage ratio), and (the fourth voltage ratio)/(the second voltage ratio) from the computed first voltage ratio, the second voltage ratio, the third voltage ratio, and the fourth voltage ratio; and determines failure of the second series circuit from (the fourth voltage ratio)/(the first voltage ratio) and (the third voltage ratio)/(the second voltage ratio).

10. The car power source apparatus as recited in claim 8, wherein the failure detection circuit determines failure of the first series circuit by comparing (the third voltage ratio)/(the first voltage ratio) and (the fourth voltage ratio)/(the second voltage ratio) with a set range of values.

11. The car power source apparatus as recited in claim 9, wherein the failure detection circuit determines failure of the second series circuit by comparing (the fourth voltage ratio)/(the first voltage ratio) and (the third voltage ratio)/(the second voltage ratio) with a set range of values.

12. The car power source apparatus as recited in claim 10, wherein the failure detection circuit determines failure of the first leakage detection switch if (the third voltage ratio)/(the first voltage ratio) and (the fourth voltage ratio)/(the second voltage ratio) are both within the set range of values.

13. The car power source apparatus as recited in claim 11, wherein the failure detection circuit determines failure of the second leakage detection switch if (the fourth voltage ratio)/(the first voltage ratio) and (the third voltage ratio)/(the second voltage ratio) are both within the set range of values.

14. The car power source apparatus as recited in claim 1, wherein the failure detection circuit determines failure of the first series circuit and the second series circuit by comparing voltage ratios with the following set range of values:

0.95<(the third voltage ratio)/(the first voltage ratio) <1.05    (a);

0.95<(the fourth voltage ratio)/(the first voltage ratio) <1.05    (b);

0.95<(the third voltage ratio)/(the second voltage ratio)<1.05    (c); and 0.95<(the fourth voltage ratio)/(the second voltage ratio)<1.05    (d).

15. The car power source apparatus as recited in claim 14, wherein for relations (a) through (d), the failure detection circuit determines failure of the first series circuit when both (a) and (d) are satisfied, and determines failure of the second series circuit when both (b) and (c) are satisfied.

* * * * *